(12) United States Patent
Hu et al.

(10) Patent No.: US 11,650,430 B2
(45) Date of Patent: May 16, 2023

(54) METHOD OF ADJUSTING OPTICAL SYSTEM

(71) Applicant: TDK TAIWAN CORP., Taoyuan (TW)

(72) Inventors: Chao-Chang Hu, Taoyuan (TW); Chih-Wei Weng, Taoyuan (TW); Shu-Shan Chen, Taoyuan (TW); Yung-Hsien Yeh, Taoyuan (TW); Sin-Jhong Song, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 692 days.

(21) Appl. No.: 16/742,154

(22) Filed: Jan. 14, 2020

(65) Prior Publication Data

US 2020/0333687 A1  Oct. 22, 2020

Related U.S. Application Data

(60) Provisional application No. 62/836,405, filed on Apr. 19, 2019.

(30) Foreign Application Priority Data

Dec. 20, 2019  (EP) ..................................... 19218896

(51) Int. Cl.
*H04N 5/225* (2006.01)
*G02B 7/00* (2021.01)
(Continued)

(52) U.S. Cl.
CPC ........... *G02B 27/646* (2013.01); *G02B 7/003* (2013.01); *G02B 7/08* (2013.01); *G02B 7/09* (2013.01); *G02B 7/1821* (2013.01); *G03B 5/00* (2013.01); *G03B 5/02* (2013.01); *G03B 5/04* (2013.01); *G03B 13/36* (2013.01);
(Continued)

(58) Field of Classification Search
CPC ........ G02B 27/646; G02B 7/003; G02B 7/08; G02B 7/09; G02B 7/1821; G02B 13/0045; H02K 11/21; H02K 41/0356; G03B 5/00; G03B 5/02; G03B 5/04; G03B 13/36; G03B 2205/0007; G03B 2205/0069; H01L 27/14618; H01L 27/14636; H01L 31/02002; H01L 31/02016; H01L 31/022466; H01L 31/02327; H01L 31/02366; H01L 31/024; H01L 31/1136; H01L 24/48; H01L 2224/48091;
(Continued)

(56) References Cited

U.S. PATENT DOCUMENTS 5,195,155 A * 3/1993 Shimaoka ............ G02B 6/4208
385/33

* cited by examiner

*Primary Examiner* — William Choi
(74) *Attorney, Agent, or Firm* — Muncy, Geissler, Olds & Lowe, P.C.

(57) ABSTRACT

A method for adjusting an optical system is provided, including a positioning device positioning a first optical module; a measuring device measuring an angular difference between a main axis of the first optical module and an optical axis of an optical element sustained by the first optical module to obtain a measurement information; an adjusting device changing the shape of an adjustment assembly of the first optical module according to the measurement information; and assembling the first optical module with an optical object, wherein the optical axis of the optical element is parallel to a central axis of the optical object.

20 Claims, 14 Drawing Sheets

(51) Int. Cl.
| | |
|---|---|
| *G02B 27/64* | (2006.01) |
| *H01L 31/0232* | (2014.01) |
| *H01L 31/113* | (2006.01) |
| *H01L 31/0236* | (2006.01) |
| *H01L 31/02* | (2006.01) |
| *H01L 27/146* | (2006.01) |
| *H01L 31/0224* | (2006.01) |
| *H01L 31/024* | (2014.01) |
| *G03B 5/00* | (2021.01) |
| *G03B 5/02* | (2021.01) |
| *G03B 5/04* | (2021.01) |
| *G02B 7/182* | (2021.01) |
| *H02K 11/21* | (2016.01) |
| *G02B 7/09* | (2021.01) |
| *G03B 13/36* | (2021.01) |
| *H02K 41/035* | (2006.01) |
| *G02B 7/08* | (2021.01) |
| *G02B 13/00* | (2006.01) |
| *H01L 23/00* | (2006.01) |

(52) U.S. Cl.
CPC .. *H01L 27/14618* (2013.01); *H01L 27/14636* (2013.01); *H01L 31/02002* (2013.01); *H01L 31/024* (2013.01); *H01L 31/02016* (2013.01); *H01L 31/02327* (2013.01); *H01L 31/02366* (2013.01); *H01L 31/022466* (2013.01); *H01L 31/1136* (2013.01); *H02K 11/21* (2016.01); *H02K 41/0356* (2013.01); *H04N 5/2253* (2013.01); *H04N 5/2254* (2013.01); *H04N 5/2257* (2013.01); *G02B 13/0045* (2013.01); *G03B 2205/0007* (2013.01); *G03B 2205/0069* (2013.01); *H01L 24/48* (2013.01); *H01L 2224/48091* (2013.01); *H01L 2224/48106* (2013.01); *H01L 2224/48225* (2013.01)

(58) Field of Classification Search
CPC .......... H01L 2224/48106; H01L 2224/48225; H04N 5/2253; H04N 5/2254; H04N 5/2257
USPC ........................................................ 359/618
See application file for complete search history.

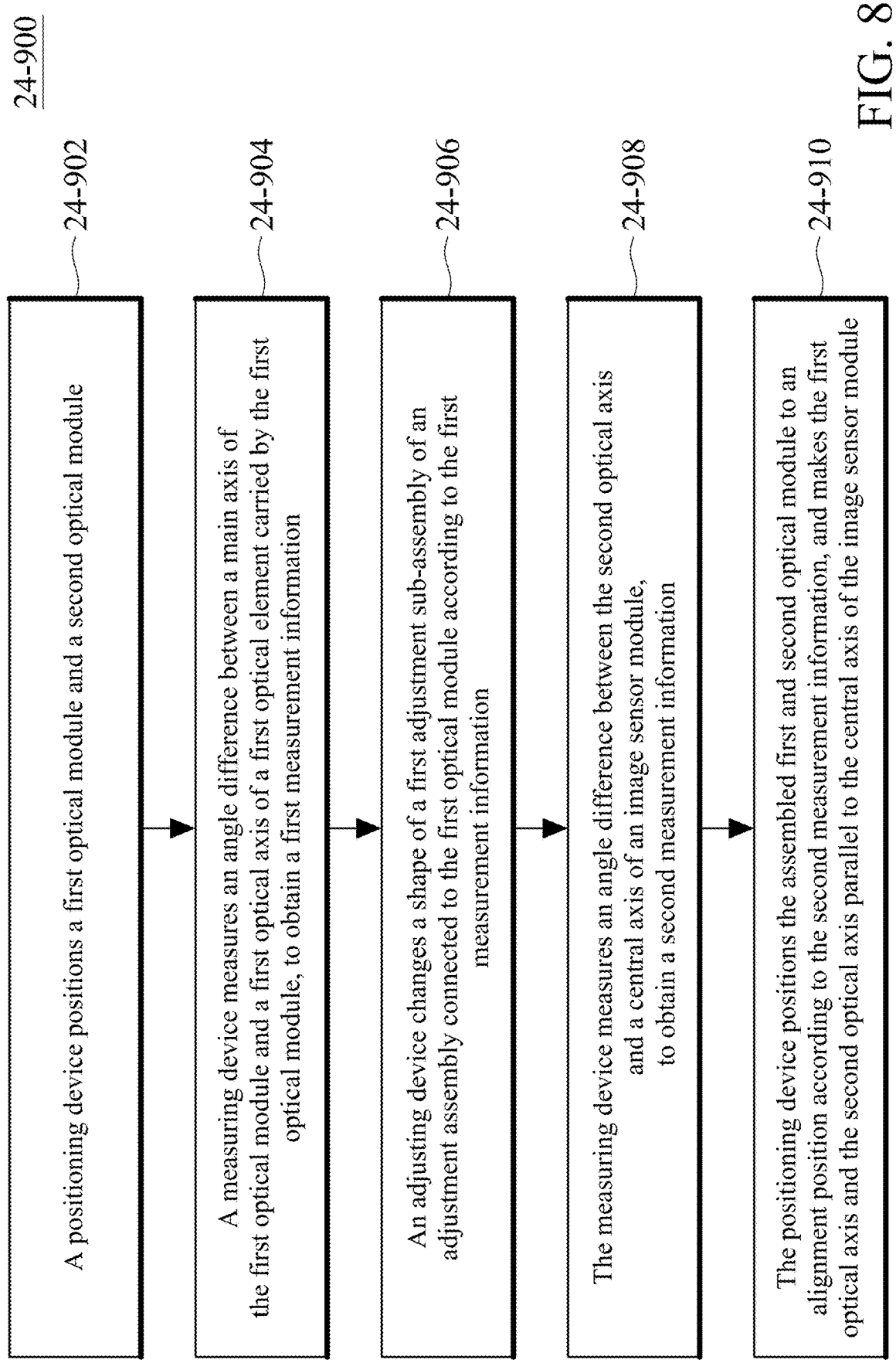

METHOD OF ADJUSTING OPTICAL SYSTEM

CROSS REFERENCE TO RELATED APPLICATIONS

This application claims the benefit of U.S. Provisional Application No. 62/836,405, filed on Apr. 19, 2019, and European Patent Application No. 19218896.9, filed on Dec. 20, 2019, the entirety of which is incorporated by reference herein.

BACKGROUND OF THE INVENTION

Field of the Invention

The application relates in general to a method for adjusting the optical system, and in particular to a method for adjusting the optical system that includes an elastic assembly and a driving assembly.

Description of the Related Art

Thanks to ongoing technological developments, recent electronic devices (such as tablet computers and smartphones) usually include a lens module capable of aiding in photography or recording video, and some are even equipped with dual lens modules, bringing users a wealth of visual enjoyment. However, an image may come out blurry if the user shakes the lens module in the electronic device when using it. To improve image quality, it is increasingly important to design an effectively shockproof lens module. In addition, designers are currently pursuing the miniaturization of such devices, and it is expected that electronic products will be smaller and lighter with each successive generation. Therefore, how to design an optical mechanism with a better optical compensation function with a smaller volume through a special configuration is an important issue.

Some camera modules are equipped with a plurality of lens elements. For high resolution, it requires higher levels of optical drive, stability and alignment, and the performance quality of Modulation Transfer Function (MTF) can be improved. The aperture performance of some lens elements requires a large aperture type product due to low light quality requirements, but the depth of focus range of the through of focus (TOF) becomes narrower. For the assembly of related components, if the lens element and the image sensor cannot be perpendicular to each other, it means that there is a tilt angle with the optical axis. If the tilt angle is too large, the TOF curve is scattered, causing the image to be out of focus and blurred. Therefore, it is an important issue to control the tilt angle between the lens element and the image sensor.

BRIEF SUMMARY OF INVENTION

To address the deficiencies of conventional products, an embodiment of the invention provides a method for adjusting an optical system, including a positioning device positioning a first optical module; a measuring device measuring an angular difference between a main axis of the first optical module and an optical axis of an optical element sustained by the first optical module to obtain a measurement information; an adjusting device changing the shape of an adjustment assembly of the first optical module according to the measurement information; and assembling the first optical module with an optical object, wherein the optical axis of the optical element is parallel to a central axis of the optical object.

In some embodiments, the adjustment assembly includes a plurality of adjustment columns, and the step of changing the shape of the adjustment assembly of the first optical module by the adjusting device according to the measurement information includes: an alignment plane formed by connecting lines of the free ends of the adjustment columns that are perpendicular to the optical axis via the adjusting device.

In some embodiments, the adjusting device is a thermal welding member, and the step of changing the shape of the adjustment assembly of the first optical module according to the measurement information using an adjusting device includes: the welding thermal welding member melting at least a part of the adjustment assembly.

In some embodiments, after the step wherein the adjusting device forms the alignment plane by connecting lines of the free ends of the adjustment columns that are perpendicular to the optical axis, the adjusting device is removed, and the optical module and the optical object are assembled. The positioning device positions a first optical module into a first position, and after the step wherein the adjusting device forms the alignment plane by connecting lines of the free ends of the adjustment columns that are perpendicular to the optical axis, the positioning device moves the first optical module from the first position into a second position, and the optical axis is parallel to the central axis.

In some embodiments, the adjusting device is disposed on the optical object and faces the adjustment assembly. After the step of the adjusting device changing the shape of the adjustment assembly, the adjusting device is still in contact with the adjustment assembly. The adjusting device includes a flat metal plate corresponding to the adjustment assembly. The adjusting device includes a thermal circuit, and the method for adjusting the optical system further comprises: connecting a heat source via the thermal circuit to heat up the flat metal plate, and the flat metal plate changes the shape of the adjustment assembly.

In some embodiments, the optical object is an image sensor module, and by changing the shape of the adjustment assembly, the optical axis of the first optical module is parallel to the central axis of the image sensor module. The optical object is a second optical module, the second optical module is configured to carry a second optical element, and when the shape of the adjustment assembly is changed using an adjusting device and the second optical module is assembled with the first optical module, the central axis of the second optical module is parallel to the optical axis of the first optical element.

In some embodiments, the measuring device is an external measuring device relative, which is outside of the first optical module. The measuring device belongs to a part of the first optical module, and the measuring device is a position-sensing assembly, which is disposed on a base of the first optical module. The positioning device includes a limiting member, and when viewed from a direction perpendicular to the main axis, the adjustment assembly protrudes from the limiting member. The image sensor module includes a filter element, and when the first optical module is assembled with the optical object, the filter element overlaps at least a part of the adjustment assembly in the main axis direction.

In some embodiments, the adjusting device is disposed on the optical object, and the optical object is in contact with the first optical module through the adjusting device. The optical object is a second optical module, the second optical module is used to carry a second optical element, and the adjusting device is disposed on an upper surface of the second optical module.

Another embodiment of the invention provides a method for adjusting an optical system, including: a positioning device positioning a first optical module and a second optical module; a measuring device measuring the angle difference between the main axis of the first optical module and the first optical axis of the first optical element carried by the first optical module, and obtaining first measurement information; an adjusting device changing the shape of the first adjustment sub-assembly of an adjustment assembly connected to the first optical module according to the first measurement information; and assembling the first optical module with a second optical module which carries a second optical element having a second optical axis, wherein the first optical axis of the first optical element is parallel to a second optical axis of the second optical element.

In some embodiments, the method for adjusting the optical system includes: the measuring device measuring the angle difference between the second optical axis and the central axis of the image sensor module, to obtain second measurement information; and the positioning device positioning the assembled first and second optical module into an alignment position according to the second measurement information, and making the first optical axis and the second optical axis parallel to the central axis of the image sensor module.

In some embodiments, the step of making the first optical axis and the second optical axis parallel to the central axis of the image sensor module includes: adjusting the shape of the second adjustment sub-assembly of the adjustment assembly using an adjusting device, and assembling the second optical module with the image sensor module.

BRIEF DESCRIPTION OF DRAWINGS

The invention can be more fully understood by reading the subsequent detailed description and examples with references made to the accompanying drawings, wherein:

FIG. 8 is a flowchart illustrating a method for adjusting an optical system according to an embodiment of the present invention.

DETAILED DESCRIPTION OF INVENTION

The making and using of the embodiments of optical systems and methods for adjusting optical systems are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
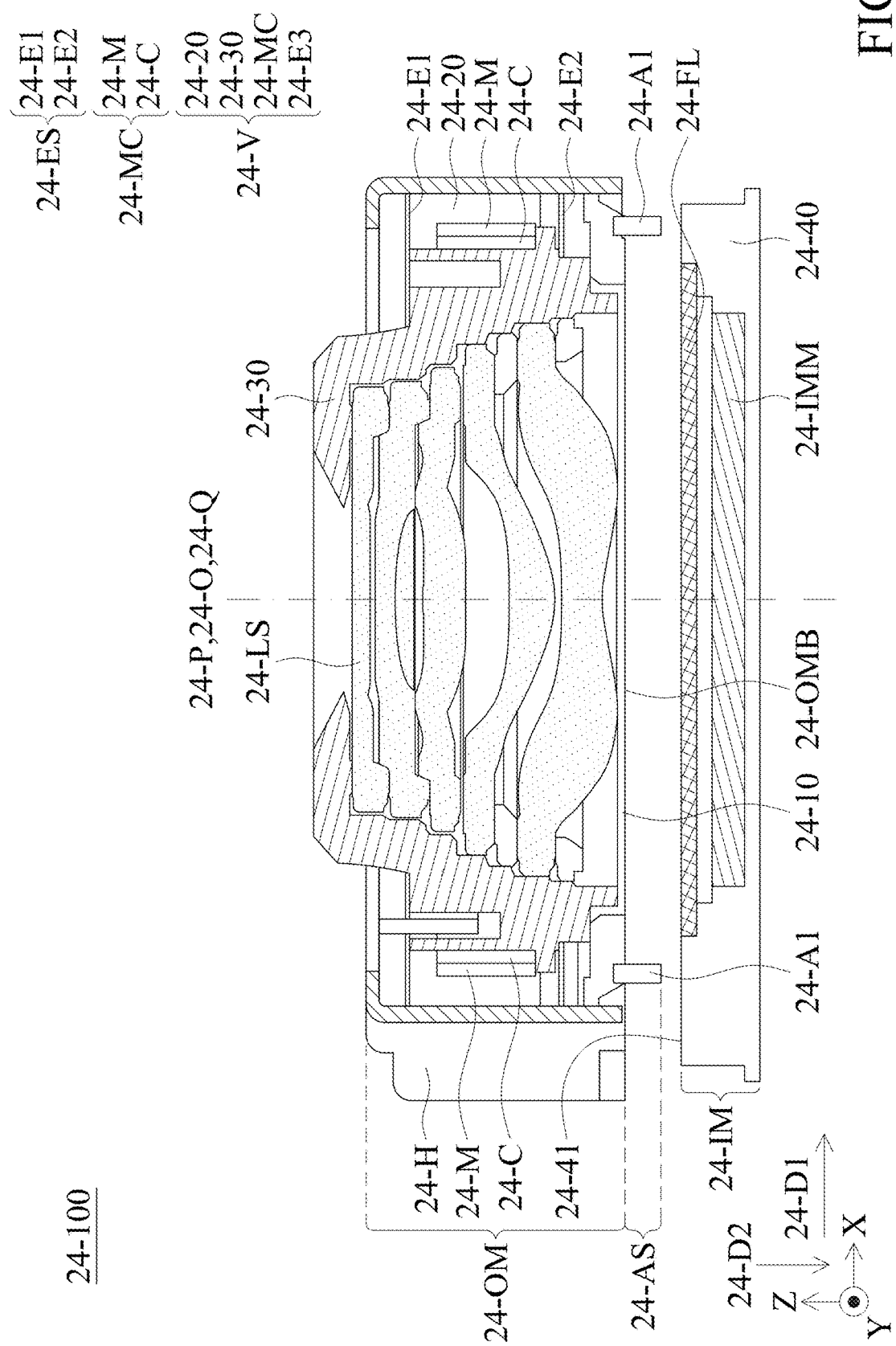
FIG. 1 is a schematic sectional view of the optical module, the adjustment assembly, and the image sensor module of the method for adjusting the optical system according to an embodiment of the present invention.

Referring to FIG. 1, FIG. 1 is a schematic view showing an optical system 24-100 according to an embodiment of the present invention. The optical system 24-100 can be disposed inside an electronic device (such as a camera, a tablet or a mobile phone). For example, when light (incident light) from the outside enters the optical system 24-100 along an incident direction, the light can pass through an optical element 24-LS (such as a lens assembly) disposed in the optical system 24-100, and then to an image sensor module 24-IM to obtain an image. The detailed structure the optical system 24-100 will be described below.

The optical system 24-100 comprises an optical module 24-OM, an image sensor module 24-IM, and an adjustment assembly 24-AS. The adjustment assembly 24-AS is located between the optical module 24-OM and the image sensor module 24-IM, and disposed on a bottom surface 24-OMB of the optical module 24-OM. Viewing along a first direction 24-D1 that is perpendicular to a main axis 24-P of the optical system 24-100 (or perpendicular to an optical axis 24-O of the optical element 24-LS), the adjustment assembly 24-AS does not overlap the optical module 24-OM.

The aforementioned optical module 24-OM may be a lens driving module including a housing 24-H, a movable portion 24-V and a base 24-10. The housing 24-H and the movable portion 24-V are disposed on the base 24-10, the housing 24-H and the base 24-10 form an accommodating space, and the movable portion 24-V is disposed in the accommodating space. The movable portion 24-V includes a frame 24-20, a holder 24-30, a driving assembly 24-MC, and an elastic assembly 24-ES. The accommodating space formed by the housing 24-H connected to and disposed on the base 24-10 can receive the movable portion 24-V (including the holder 24-30, the drive assembly 24-MC and elastic assembly 24-ES) for protection.

The holder 24-30 is used to carry the optical element 24-LS, and is movably connected to the base 24-10 and the frame 24-20 through the elastic assembly 24-ES. The driving assembly 24-MC is disposed on the holder 24-30 and the frame 24-20, and is used to drive the holder 24-30 and the optical element 24-LS to move relative to the base 24-10 and the frame 24-20 to adjust the posture or position of the optical element 24-LS, thereby achieving the purpose of optical auto-focusing (AF) or optical image stabilization (OIS).

In detail about the elastic assembly 24-ES, the elastic assembly 24-ES includes a first elastic element 24-E1 and a second elastic element 24-E2, which are respectively disposed on the upper and lower sides of the holder 24-30, and movably connected to the holder 24-30, the base 24-10 and the frame 24-20, so that the holder 24-30 can move relative to the base 24-10 and the frame 24-20.

The aforementioned driving assembly 24-MC may be an electromagnetic driving assembly, which includes a coil 24-C and a magnetic element 24-M, which are respectively disposed on movable portion 24-30 and the frame 20. The magnetic element 24-M and the coil 24-C correspond to each other. When a driving signal is applied to the driving assembly 24-MC (for example, by applying an electric current through an external power source to the coil 24-C), a magnetic force is generated between the magnetic element 24-M and the coil 24-C, thereby the driving assembly 24-MC can drive the movable portion 24-30 with the optical element 24-LS to move relative the base 24-10, to achieve the effect of anti-shake or auto-focus of optical image. In this embodiment, the driving assembly 24-MC is a moving coil type; in another embodiment, it may be a moving magnetic type. In addition, before the driving signal is applied, the aforementioned elastic assembly 24-ES can keep the movable portion in an initial position relative to the base 24-10.

Figure 2:
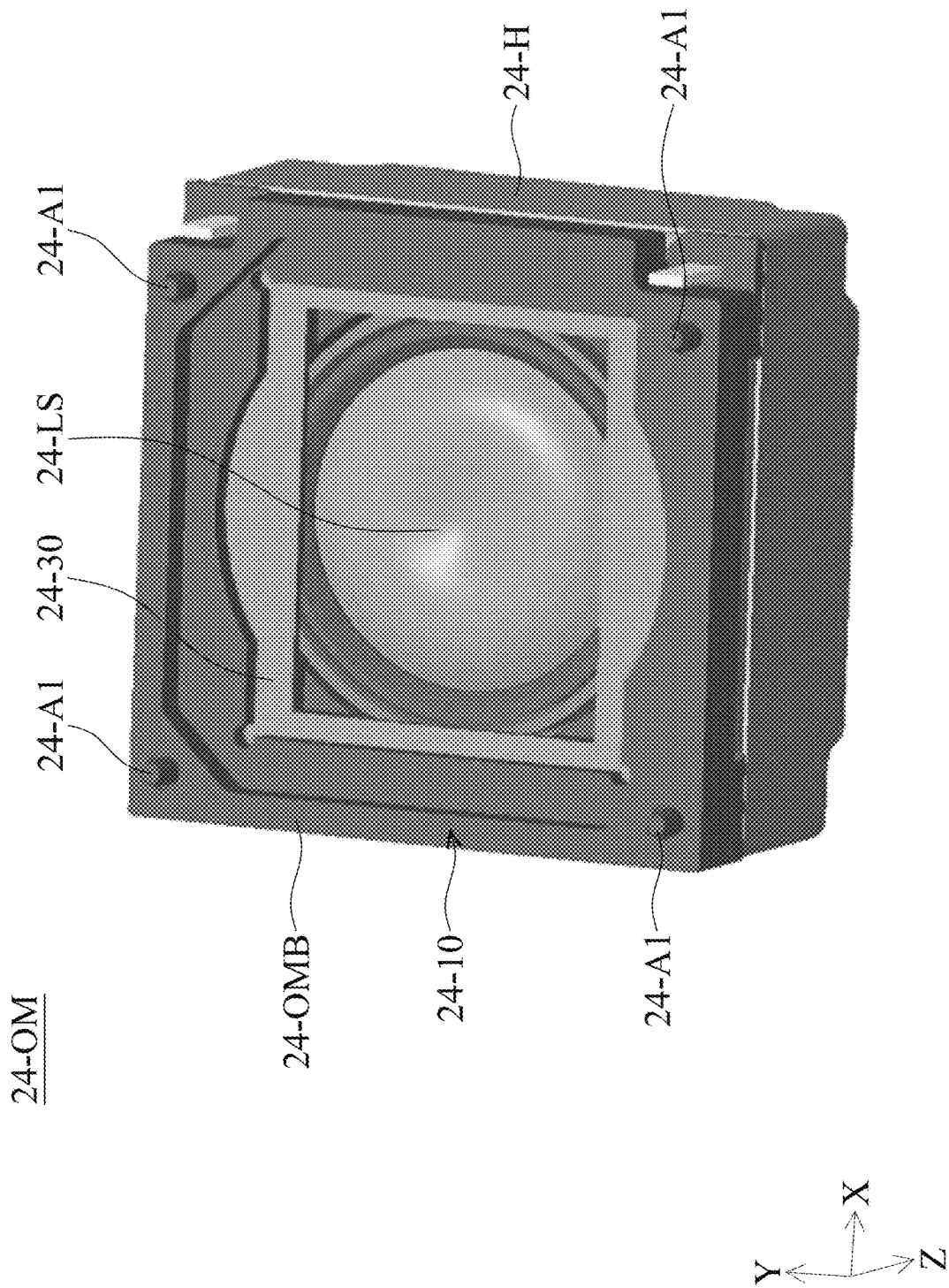
FIG. 2 is a perspective bottom view of the optical module in FIG. 1.

Referring to FIGS. 1 and 2, the aforementioned adjustment assembly 24-AS includes a plurality of adjustment columns 24-A1, which are disposed on the bottom surface 24-OMB of the base 24-10 and extend along a second direction 24-D2 (the second direction 24-D2 is not perpendicular to the optical axis 24-O, such as parallel or approximately parallel to the Z-axis), and is used to adjust the relative positions of the optical module 24-OM and the image sensor module 24-IM. Specifically, the adjustment assembly 24-AS are used to adjust the optical axis 24-O of the optical element 24-LS set in the optical module 24-OM and the central axis 24-Q of the image sensor module 24-IM so that they overlap or are parallel.

In this embodiment, the adjustment assembly 24-AS includes four adjustment columns 24-A1, which are disposed at the edges of the bottom surface 24-OMB of the optical module 24-OM and located on different sides of the bottom surface 24-OMB. It should be noted that, in other embodiments, the adjusting assembly 24-AS may include three adjusting columns 24-A1, which are disposed at the edges of the bottom surface 24-OMB of the optical module 24-OM, and all three are located on the different sides of the bottom surface 24-OMB.

Figure 3A:
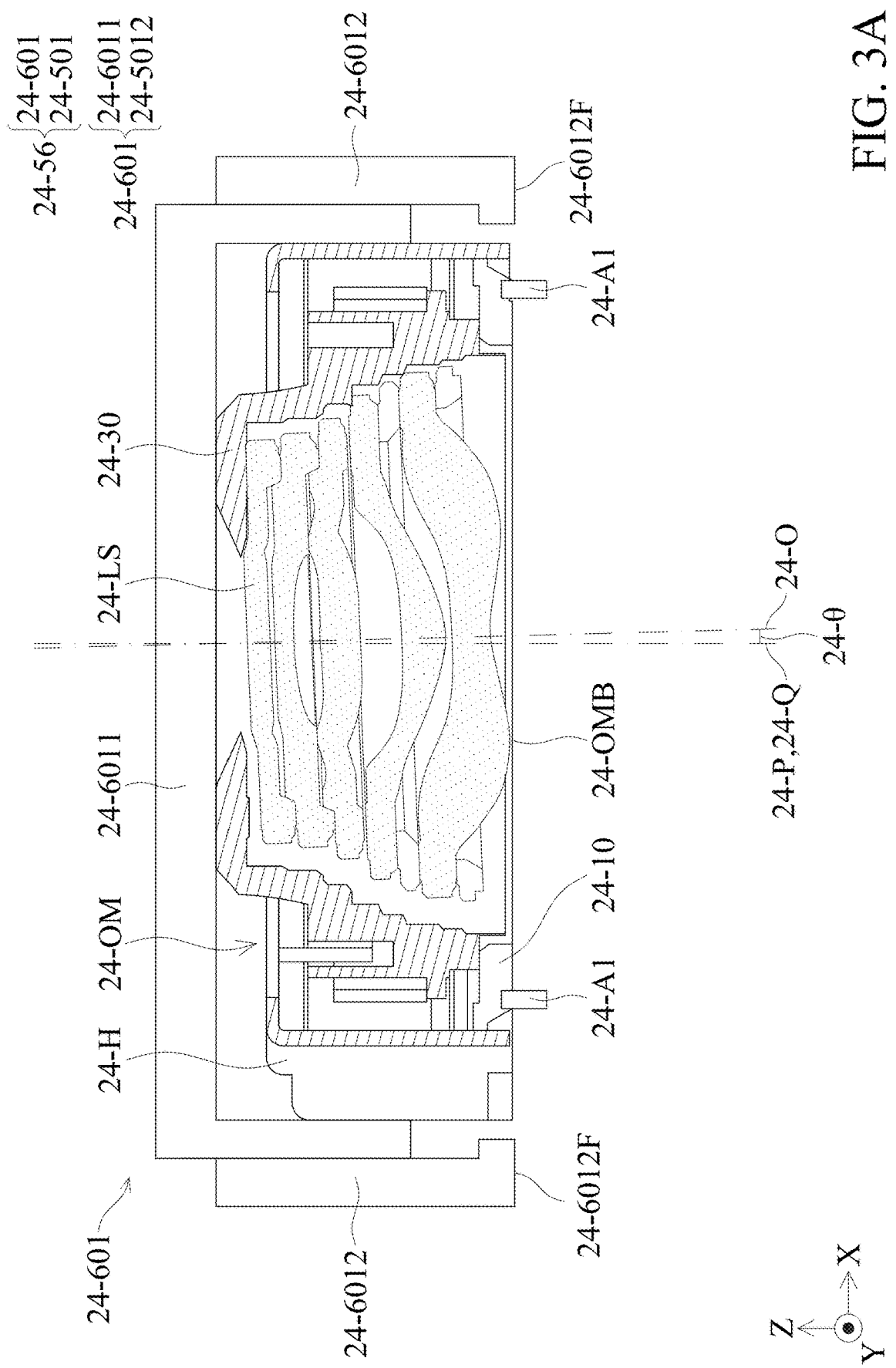
FIGS. 3A to 3D are schematic diagrams showing the optical system in FIG. 1 being assembled and adjusted.

Referring to FIG. 3A, when performing the assembling process of the image sensor module 24-IM and the optical module 24-OM, a positioning device 24-601 positions the optical module 24-OM into a first position, wherein the positioning device 24-601 includes a holding member 24-6011 and a limiting member 24-6012. The holding member 24-6011 is used to clamp the top of the optical module 24-OM. The limiting member 24-6012 is provided on two sides of the holding member 24-6011 or the optical module 24-OM, and used to limit or restrict the position of the optical module 24-OM, to avoid damage caused by excessive shaking during the assembly process. In addition, when viewed from a direction that is perpendicular to the main axis 24-P, the adjustment assembly 24-AS protrudes from a limiting surface 24-6012F of the limiting member 24-6012, and the limiting surface 24-6012F is protruding from the base 24-10 of the optical module 24-OM.

Figure 3B:
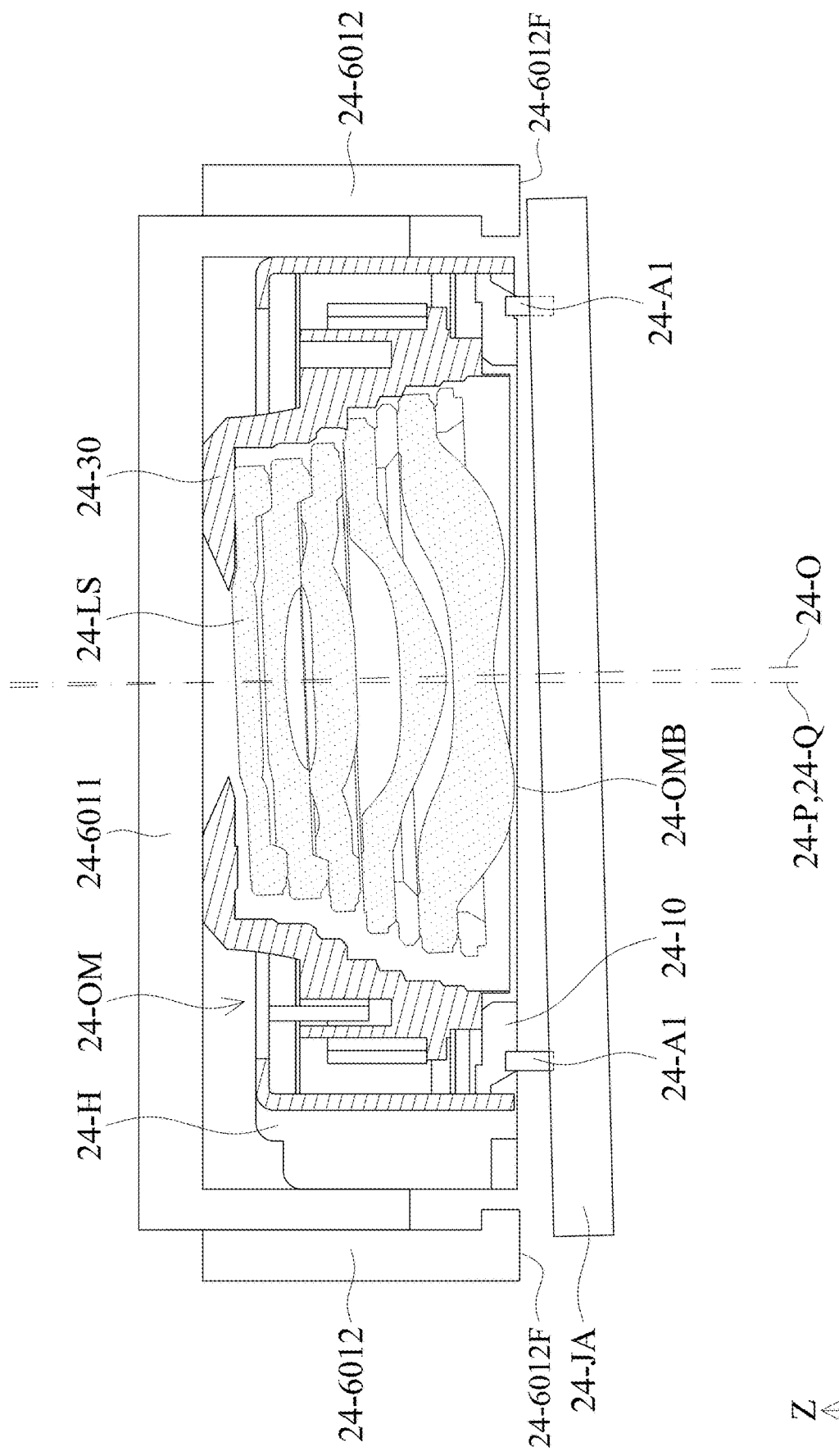

Continuing to refer to FIG. 3A, when the optical element 24-LS is disposed on the optical module 24-OM and the main axis 24-P is relatively inclined or skewed relative to the optical axis 24-O (for example, the optical element 24-LS placed in the holder 24-30 and is not fully aligned with the center of the holder 24-30 will make the optical axis 24-O and the main axis 24-P not parallel or coincide), the angle difference 24-θ between the two is obtained by a measuring device 24-501 (such as an angle measuring device), to provide a measuring information 24-S1. Next, the measuring device 24-501 transmits the measurement information 24-S1 to an adjusting device 24-JA. The adjusting device 24-JA changes the shape or appearance of the adjusting assembly 24-AS according to the aforementioned measurement information 24-S1, as shown in FIG. 3B. The adjusting device 24-JA can be a thermal welding member, such as a thermal welding head, and the shape of the adjusting assembly 24-AS can be changed by hot melting. In addition, since the limiting surface 24-6012F of the limiting member 24-6012 protrudes from the base 24-10 of the optical module 24-OM, when the adjusting device 24-JA presses the adjustment assembly 24-AS and the optical module 24-OM, the damage to optical module 24-OM can be avoided to protect the optical module 24-OM.

In this embodiment, due to the inclination angle of the optical axis 24-O (relative to the main axis 24-P) determined via the measuring device 24-501, the adjusting device 24-JA changes the adjustment columns 24-A1, so that the connecting line 24-CL of the free ends of the adjustment columns 24-A1 is perpendicular to the optical axis 24-O, or say an alignment plane 24-CP that is formed by connecting lines of at least three free ends of the adjustment columns 24-A1 is perpendicular to the optical axis 24-O.

Figure 3C:
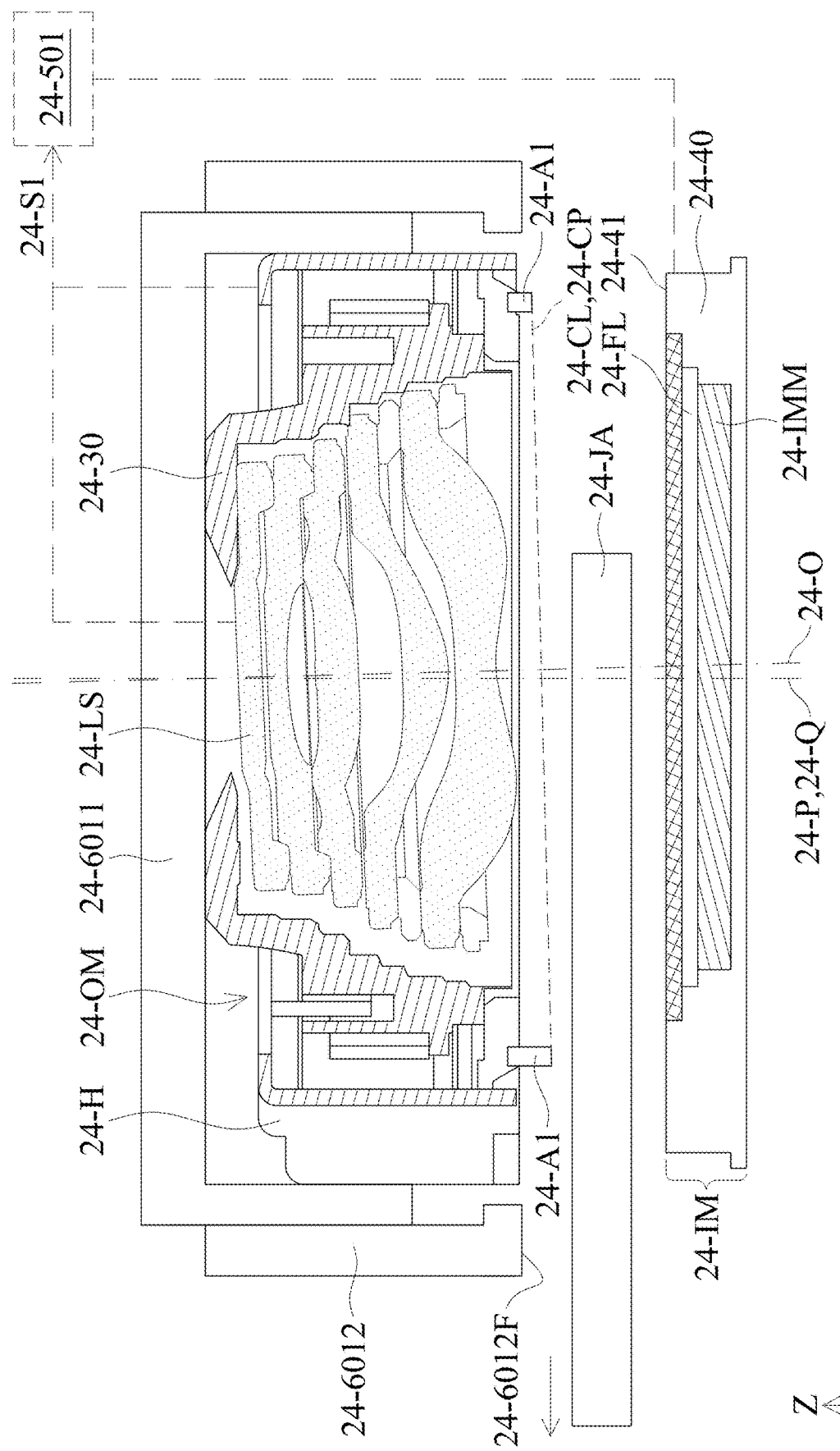
Figure 3D:
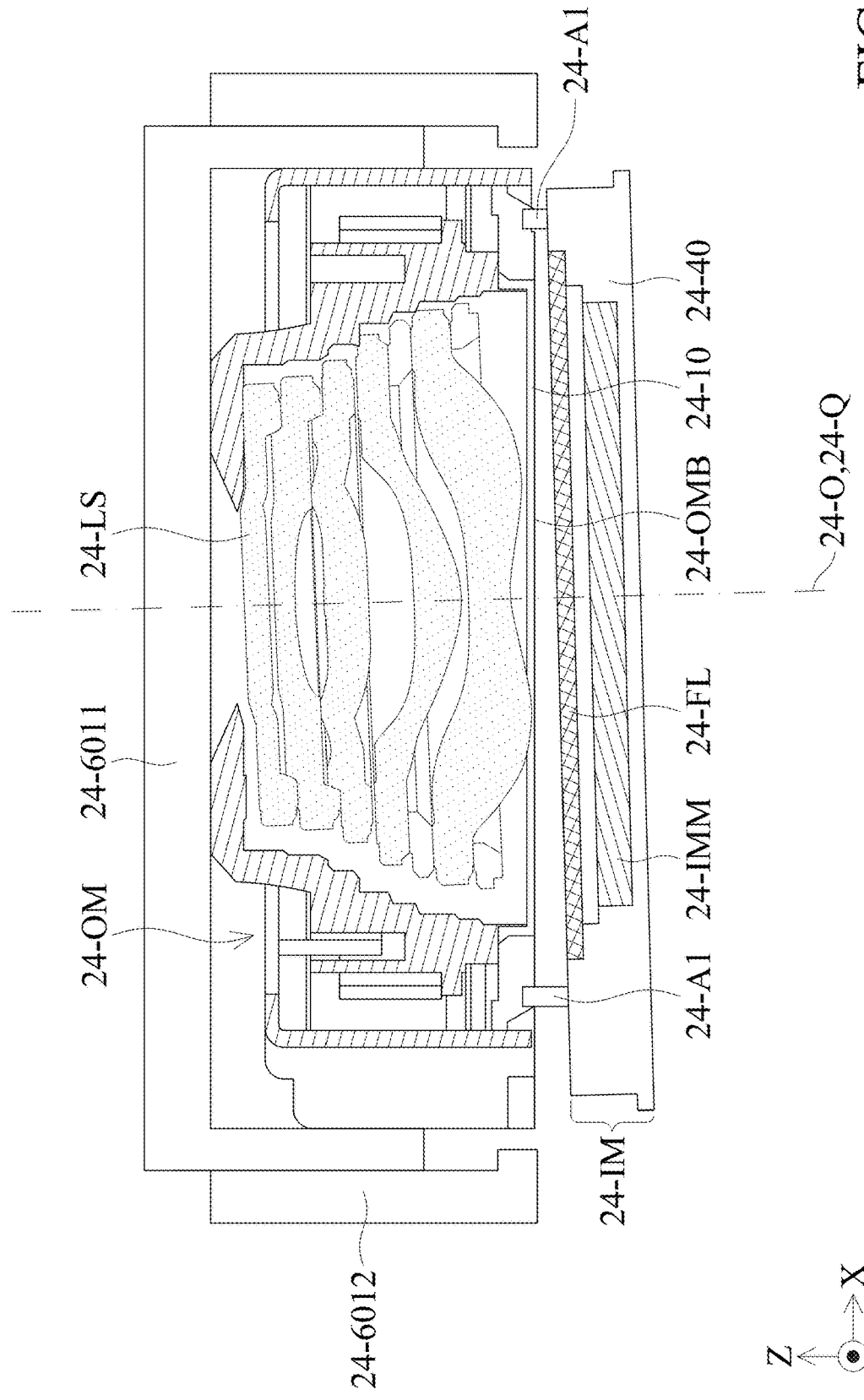

As shown in FIGS. 3B to 3C, the height of the right adjustment column 24-A1 on the Z-axis is more reduced than that of the left adjustment column 24-A1 on the Z-axis, so that the alignment plane 24-CP is perpendicular to the optical axis 24-O. And then, the adjusting device 24-JA is removed. In this way, the image sensor module IM is then placed on these adjusted adjustment columns 24-A1. As shown in FIG. 3D, the central axis 24-Q of the image sensor module 24-IM is parallel or coincides the optical axis 24-O, to achieve good alignment between the modules.

In some embodiments, the measuring device 24-501 may determine an angular difference between the optical axis 24-O in the 24-OM and the central axis 24-Q of the image sensor module 24-IM based on the degree of blur and focus of the image obtained by light through the optical module 24-OM to the image sensor module 24-IM.

In some embodiments, the image sensor module 24-IM includes a filter element 24-FL, which is disposed on the image sensor element 24-IMM, which may be an infrared filter that filters infrared light to the image sensor element 24-IMM. In the direction that is perpendicular to the main axis 24-P or in the main axis 24-P direction, the filter element 24-FL is located between the aforementioned adjustment columns 24-A1 and does not overlap with the adjustment columns 24-A1. In some embodiments, in the main axis 24-P direction, the filter element 24-FL is embedded in the base 24-10 and overlaps at least a part of the adjustment columns 24-A1.

Figure 4:
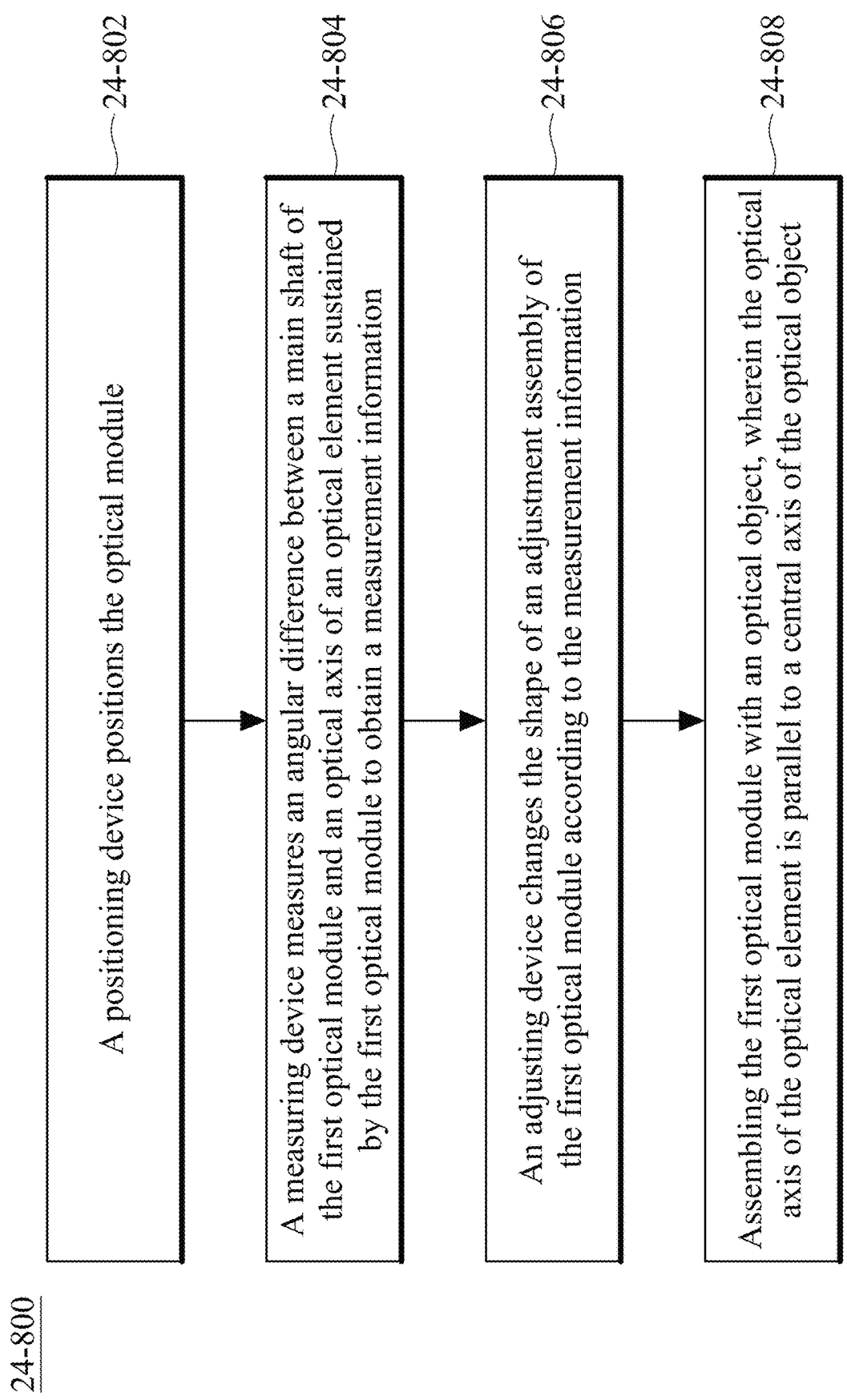
FIG. 4 is a flowchart illustrating a method for adjusting an optical system according to an embodiment of the present invention.

According to the above embodiment, the present invention provides a method for adjusting the optical system 24-800. As shown in FIG. 4, first, a positioning device positions the optical module (step 24-802), and then a measuring device measures an angular difference between the main axis of the first optical module and the optical axis of an optical element sustained by the first optical module to obtain measurement information (step 804). Then, an adjusting device changes the shape of an adjustment assembly of the first optical module according to the measurement information (step 24-806), and assembling the first optical module with an optical object (such as an image sensor module or the second optical module in FIG. 7A), wherein the optical axis of the optical element is parallel to the central axis of the optical object (step 24-808).

In this way, the method for adjusting the optical system 24-800 is provided with an adjustment module 24-AS between the optical module 24-OM and the image sensor module 24-IM, and the appearance of the adjustment assembly 24-AS can be changed, so that the assembly of the image sensor module 24-IM and the optical module 24-OM can be accurately adjusted, and the central axis 24-Q and the optical axis 24-O are parallel or coincide, so as to improve the image quality of the device.

In some embodiments, as shown in FIG. 5, another adjusting device 24-JA' may be disposed on the bottom plate 24-40 of the image sensor module 24-IM, which includes a flat or planar metal plate 24-JA'1 facing the adjustment assembly 24-AS, and can be connected to an external heat source through a heating circuit of the adjusting device 24-JA' to make it heat up. When the image sensor module 24-IM and the optical module 24-OM are being assembled, the shape of the adjustment columns 24-A1 can be changed by the heat provided via the flat metal plate 24-JA'1 of the adjusting device 24-JA'. In this way, compared with an externally independent adjusting device 24-JA in FIG. 3B, after the steps of the adjusting device 24-JA' in this embodiment changing the adjustment assembly 24-AS is complete, the adjusting device 24-JA' continues in contact with the adjustment assembly 24-AS, which can save the procedure of removing the adjusting device 24-JA'.

Figure 5A:
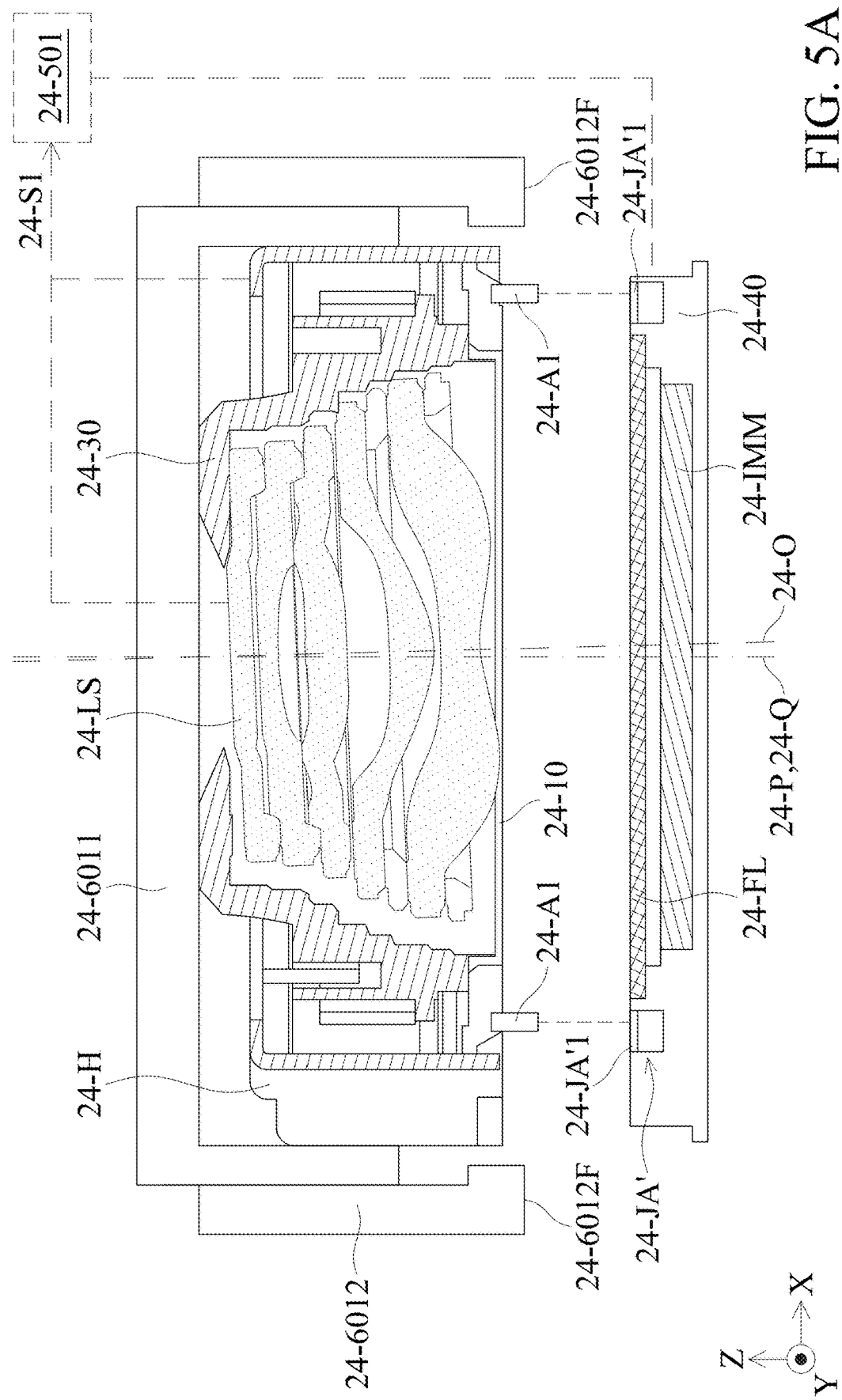
FIGS. 5A to 5B are schematic diagrams of an optical system according to another embodiment of the present invention.
Figure 5B:
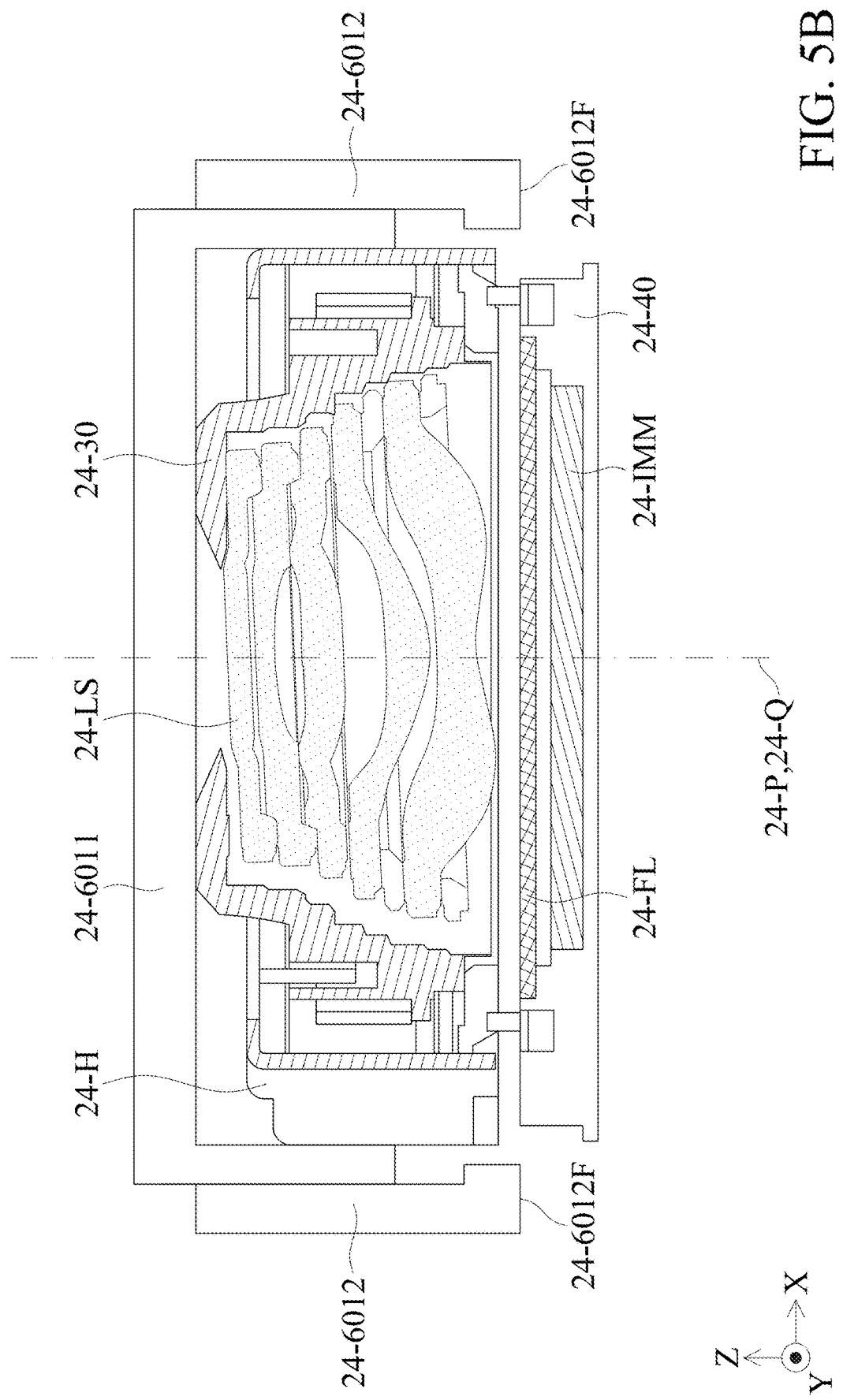

In some embodiments, after the adjusting device changed the shape of the adjustment assembly of the first optical module according to the measurement information (step 24-804), the position of the optical module 24-OM can be adjusted through the positioning device 24-601, as shown in FIGS. 3C and 5A, which shows that the optical module 24-OM moves from the first position (FIG. 3C) to the second position (FIG. 5A). So that the optical axis is parallel to the central axis, and then the optical module 24-OM and the image sensor module 24-IM are assembled, as shown in FIG. 5B. In this embodiment, the optical module 24-OM is placed on the image sensor module 24-IM.

Figure 6:
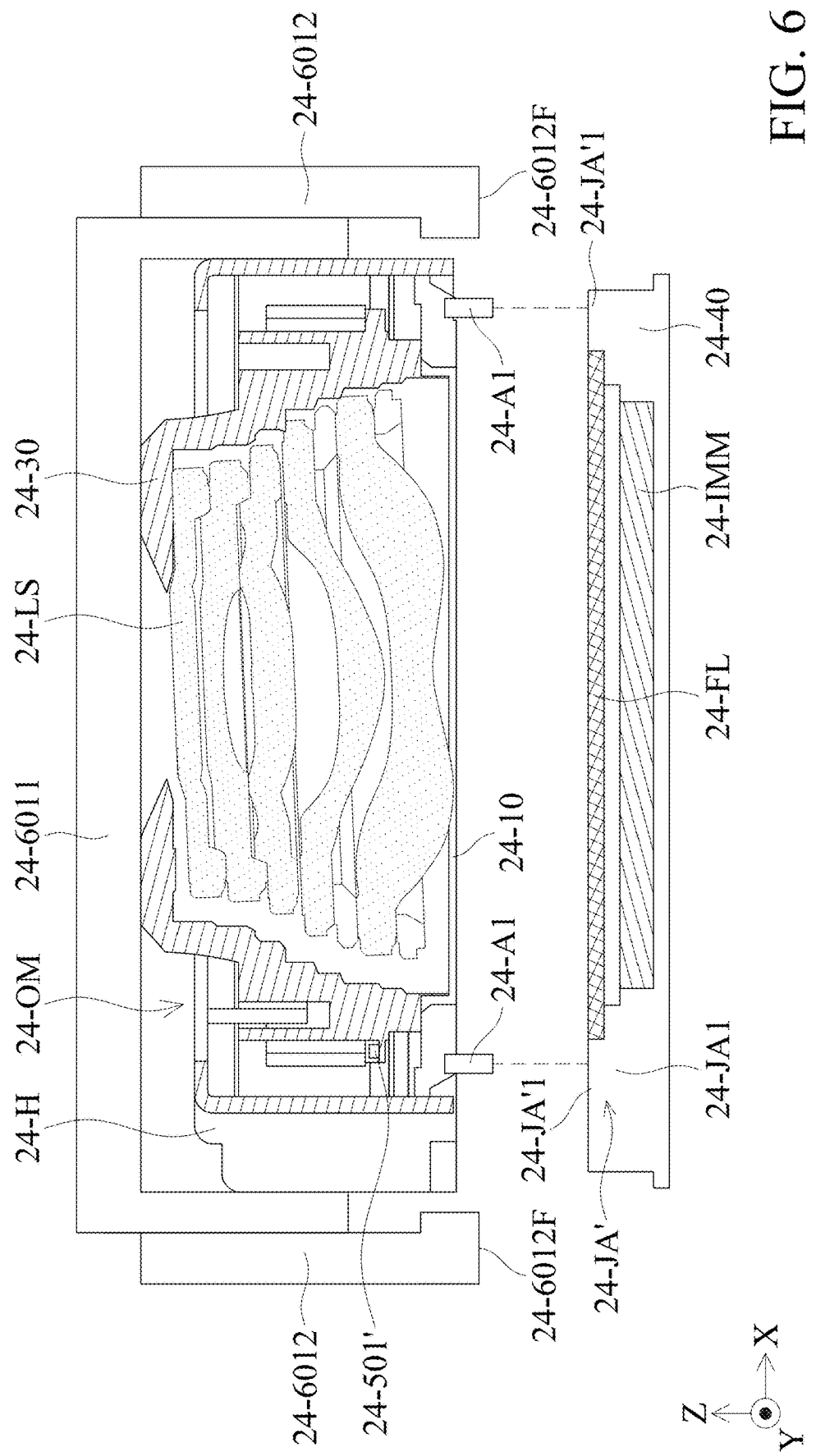
FIG. 6 is a schematic diagram of an optical system according to another embodiment of the present invention.

As shown in FIG. 6, in some embodiments, the measuring device 24-501' belongs to a part of the optical module 24-OM, and may be a position-sensing assembly disposed on the base 24-10 of the optical module 24-OM. In some embodiments, it also can be the position sensor for the driving assembly 24-MC. This can save an external measuring device.

Figure 7A:
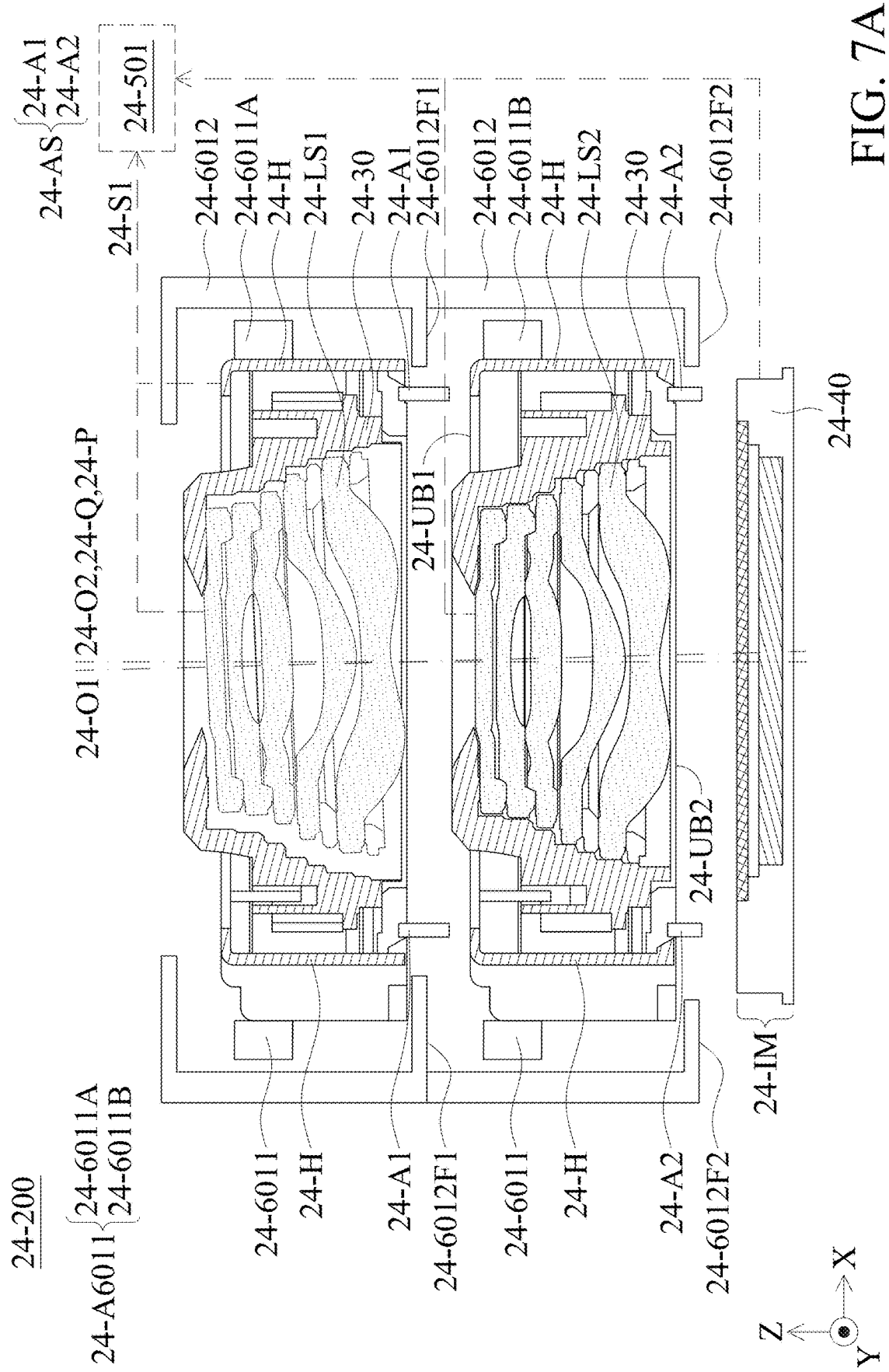
FIGS. 7A to 7C are schematic diagrams showing an optical system being assembled and adjusted according to another embodiment of the present invention.
Figure 7B:
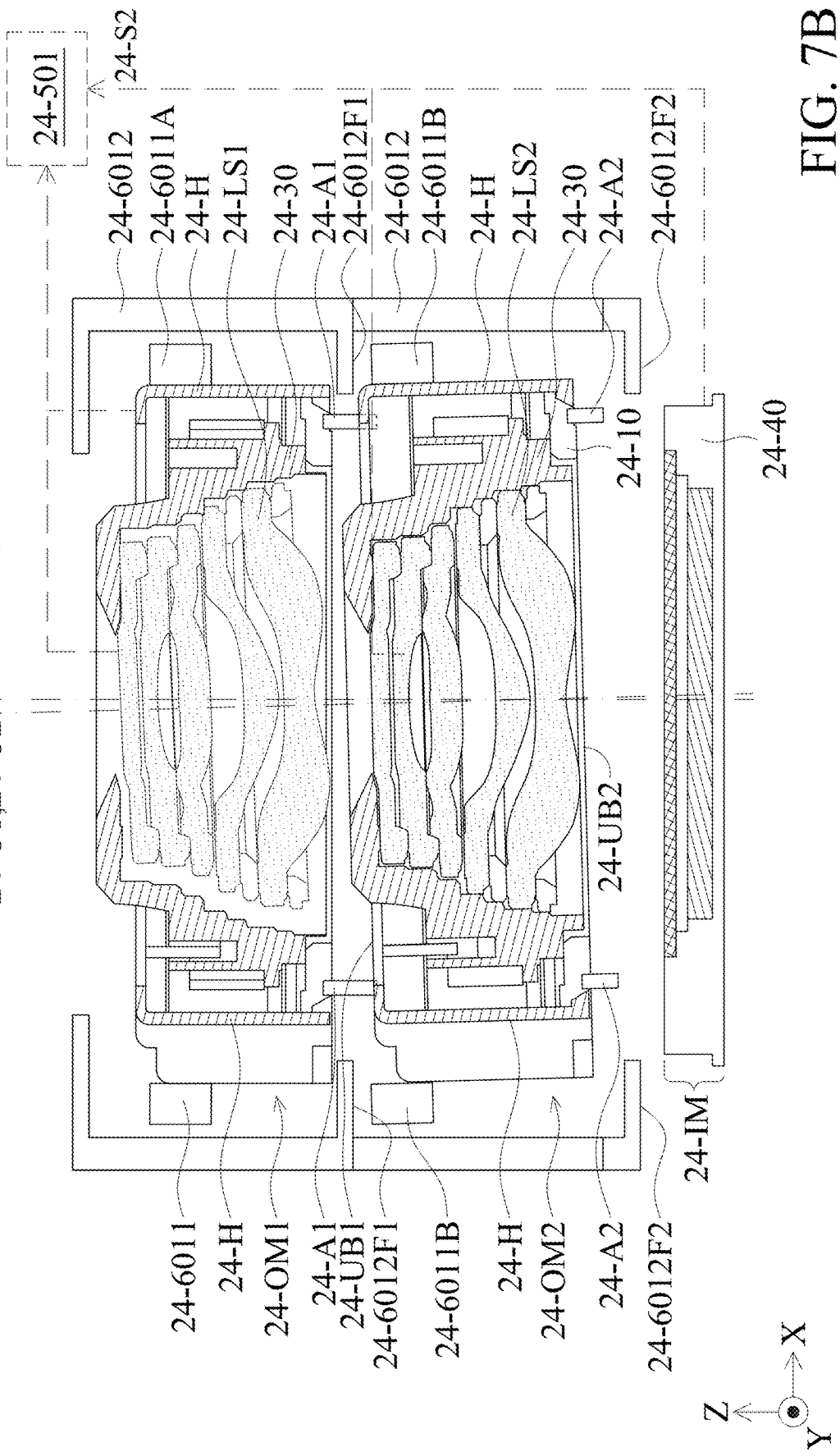
Figure 7C:
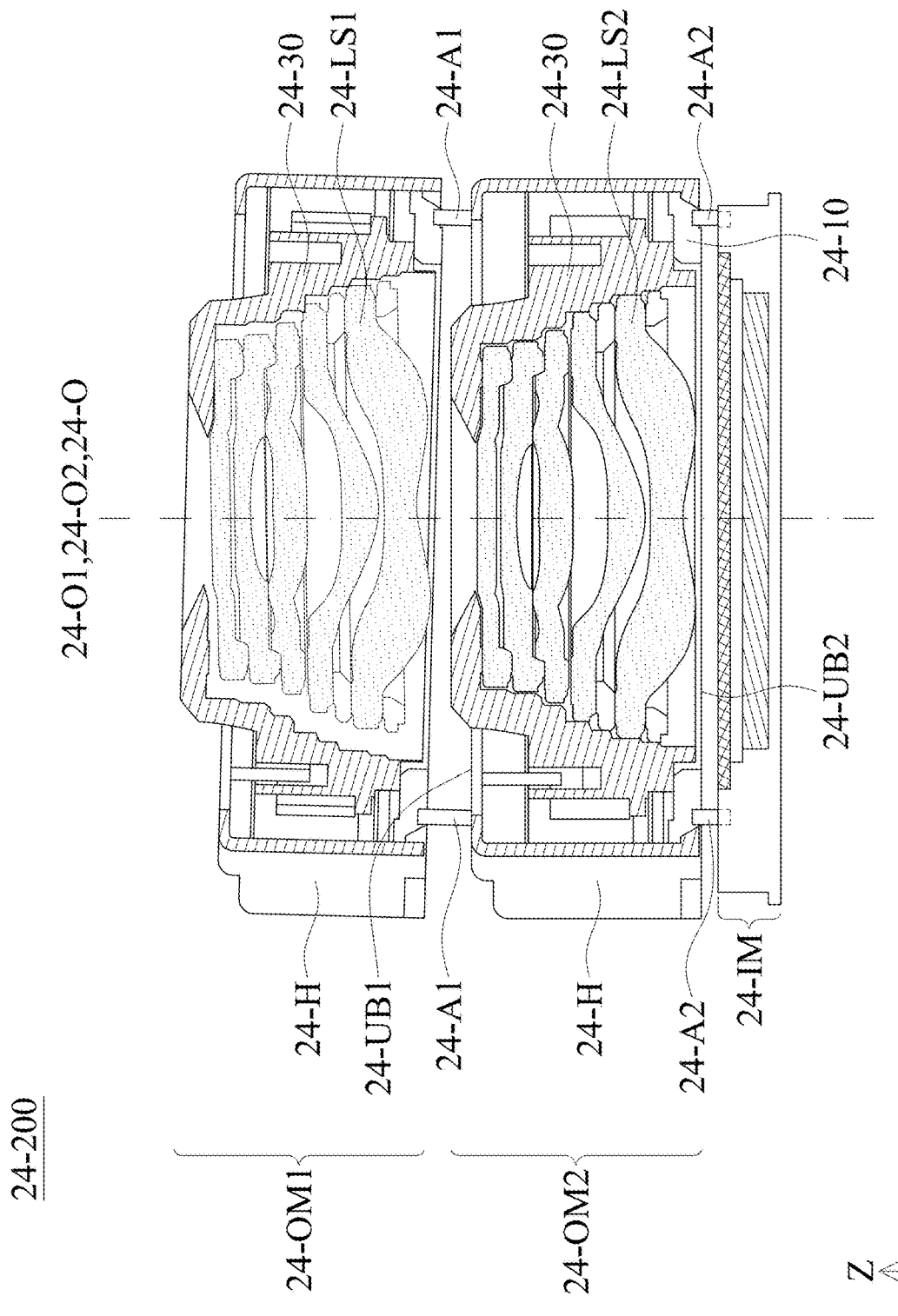

FIGS. 7A to 7C show the optical system 24-200 of another embodiment in the present invention. Different from the optical system 24-100 in FIG. 1, the optical system 24-200 in this embodiment has two optical modules: a first optical module 24-OM1 and a second optical module 24-OM2, wherein they can be the same or similar components, or with slightly different appearances and proportion scale. The adjustment assembly 24-AS has a plurality of first adjustment columns 24-A1 (first adjustment sub-assembly) and a plurality of second adjustment columns 24-A2 (second adjustment sub-assembly). The first optical module 24-OM1, the first adjustment columns 24-A1, the second optical module 24-OM2, the second adjustment columns 24-A2, and the image sensor module 24-IM are sequentially arranged along the first optical axis 24-O1 of the first optical element 24-LS1 (or the second optical axis 24-O2 of the second optical element 24-LS2, the main axis 24-P of the first optical module 24-OM1, the central axis 24-Q of the image sensor module 24-IM).

When the first and second optical modules 24-OM1, 24-OM2, and image sensor module 24-IM are to be assembled, first, as shown in FIG. 7A, the holding member 24-6011A of the positioning device 24-601 holds the first optical module 24-OM1 for positioning. When the first optical element 24-LS1 and the first optical module 24-OM1 are relatively inclined, the angle difference between the main axis 24-P and the first optical axis 24-O1 is obtained by the measuring device 24-501, and the first measurement information 24-S1 is obtained.

Next, as shown in FIG. 7B, the upper surface 24-UB1 of the second optical module 24-OM2 is pressed against the adjustment sub-assembly 24-A1 on the bottom surface 24-OMB of the base 24-10 of the first optical module 24-OM1, and the shape of first adjustment columns 24-A1 is changed according to the aforementioned first measurement information 24-S1, for example, through the adjusting device 24-JA provided on the optical object in FIG. 5A (or the external adjusting device 24-501 as shown in FIG. 3B, which causes the first adjustment columns 24-A1 to be heated to change its shape), wherein the limiting surface 24-6012F1 of the limiting member 24-6012 provides a restricting function, which can avoid hurting the first optical module 24-OM1, and align the first and second optical axes 24-O1, 24-O2 of the first and second optical modules 24-OM1, 24-OM2.

Next, as shown in FIG. 7C, the angle difference between the second optical axis 24-O2 and a central axis 24-Q of the image sensor module 24-IM is measured by the measuring device 24-501, to obtain a second measuring information 24-S2. The positioning device 24-601 then moves the assembled first and second optical modules 24-OM1, 24-OM2 into an alignment position according to the second measurement information 24-S2, so that the first and second optical axes 24-O1, 24-O2 can be parallel or coincide with the central axis 24-Q of the image sensor module 24-IM, and then the first and second optical modules 24-OM1, 24-OM2 is assembled with the image sensor module 24-IM. The shape of the second adjustment sub-assembly 24-A2 (located on the lower surface 24-UB2 of the second optical module 24-OM1) can be changed by the contact of the image sensor module 24-IM (for example, using the method in FIG. 5A). Furthermore, the limiting surface 24-6012F2 of the limiting member 24-6012 can avoid damage to the second optical module 24-OM2. In this way, the first and second optical axes 24-O1, 24-O2, and the central axis 24-Q can be made parallel or coincide, so that the optical system 200 has excellent alignment between modules.

According to the above embodiment, the present invention provides a method for adjusting an optical system 24-900, as shown in FIG. 8. First, a positioning device positions a first optical module and a second optical module (step 24-902), and a measuring device measures the angle difference between the main axis of the first optical module and the first optical axis of the first optical element carried by the first optical module, to obtain first measurement information (step 24-904). An adjusting device changes the shape of the first adjustment sub-assembly of the adjustment assembly connected to the first optical module according to the first measurement information (step 24-906).

In some embodiments, the method for adjusting the optical system 24-900 further comprises: the measuring device measuring the angle difference between the second optical axis and the central axis of the image sensor module, to obtain second measurement information (step 24-908), and the positioning device positions the assembled first and second optical module into an alignment position according to the second measurement information, and makes the first optical axis and the second optical axis parallel to the central axis of the image sensor module (steps 24-910). The step 24-910 includes: adjusting the shape of a second adjustment sub-assembly of the adjustment assembly using an adjusting device, and assembling the second optical module with the image sensor module.

It should be noted that the features of the various embodiments can be combined and used as long as they do not violate or conflict the scope of the disclosure.

In summary, an embodiment of the present invention provides a method for adjusting the optical system, including a positioning device positioning a first optical module; a measuring device measuring an angular difference between the main axis of the first optical module and the optical axis of an optical element sustained by the first optical module to obtain measurement information; an adjusting device changing the shape of an adjustment assembly of the first optical module according to the measurement information; and assembling the first optical module with an optical object, wherein the optical axis of the optical element is parallel to the central axis of the optical object.

The embodiment of the present invention has at least one of the following advantages or effects. Through the adjustment assembly, a plurality of optical modules can be aligned with each other, and one or more optical modules and an image sensor module can be aligned with each other, so as to improve the quality of the device. In addition, since the adjustment assembly can change its shape during adjustment process (usually being squeezed and reduced in height in the vertical direction), the adjustment between the optical module and the image sensor module can be more accurate and greatly improved product quality.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:

1. A method for adjusting an optical system, comprising:
    a positioning device positioning a first optical module;
    a measuring device measuring an angular difference between a main axis of the first optical module and an optical axis of an optical element sustained by the first optical module to obtain a measurement information;
    an adjusting device changing the shape of an adjustment assembly of the first optical module according to the measurement information; and
    assembling the first optical module with an optical object, wherein the optical axis of the optical element is parallel to a central axis of the optical object.

2. The method for adjusting the optical system as claimed in claim 1, wherein the adjustment assembly includes a plurality of adjustment columns, and the step of changing the shape of the adjustment assembly of the first optical module according to the measurement information using an adjusting device includes:
    an alignment plane formed by connecting lines of the free ends of the adjustment columns that are perpendicular to the optical axis with the adjusting device to adjust the adjustment columns.

3. The method for adjusting the optical system as claimed in claim 1, wherein the adjusting device is a thermal welding member, and the step of changing the shape of the adjustment assembly of the first optical module according to the measurement information using an adjusting device includes:
    the thermal welding member melting at least a part of the adjustment assembly.

4. The method for adjusting the optical system as claimed in claim 2, wherein after the step wherein the adjusting device forms the alignment plane by connecting lines of the free ends of the adjustment columns that are perpendicular to the optical axis, the adjusting device is removed, and the optical module and the optical object are assembled.

5. The method for adjusting the optical system as claimed in claim 2, wherein the positioning device positions a first optical module into a first position, and after the step wherein the adjusting device makes the alignment plane formed by connecting lines of the free ends of the adjustment columns that are perpendicular to the optical axis, the positioning device moves the first optical module from the first position into a second position, and the optical axis is parallel to the central axis.

6. The method for adjusting the optical system as claimed in claim 1, wherein the adjusting device is disposed on the optical object and faces the adjustment assembly.

7. The method for adjusting the optical system as claimed in claim 6, wherein after the step of the adjusting device changing the shape of the adjustment assembly, the adjusting device is still in contact with the adjustment assembly.

8. The method for adjusting the optical system as claimed in claim 6, wherein the adjusting device includes a flat metal plate corresponding to the adjustment assembly.

9. The method for adjusting the optical system as claimed in claim 8, wherein the adjusting device includes a thermal circuit, and the method for adjusting the optical system further comprises:
    connecting a heat source via the thermal circuit to heat up the flat metal plate, and the flat metal plate changes the shape of the adjustment assembly.

10. The method for adjusting the optical system as claimed in claim 1, wherein the optical object is an image sensor module, and by changing the shape of the adjustment assembly, the optical axis of the first optical module is parallel to the central axis of the image sensor module.

11. The method for adjusting the optical system as claimed in claim 1, wherein the optical object is a second optical module, the second optical module is configured to carry a second optical element, and when the shape of the adjustment assembly is changed using the adjusting device and the second optical module is assembled with the first optical module, the central axis of the second optical module is parallel to the optical axis of the first optical element.

12. The method for adjusting the optical system as claimed in claim 1, wherein the measuring device is an external measuring device, which is outside of the first optical module.

13. The method for adjusting the optical system as claimed in claim 1, wherein the measuring device belongs to a part of the first optical module, and the measuring device is a position-sensing assembly, which is disposed on a base of the first optical module.

14. The method for adjusting the optical system as claimed in claim 1, wherein the positioning device includes a limiting member, and when viewed from a direction perpendicular to the main axis, the adjustment assembly protrudes from the limiting member.

15. The method for adjusting the optical system as claimed in claim 10, wherein the image sensor module includes a filter element, and when the first optical module is assembled with the optical object, the filter element overlaps at least a part of the adjustment assembly in the main axis direction.

16. The method for adjusting the optical system as claimed in claim 1, the adjusting device is disposed on the optical object, and the optical object is in contact with the first optical module through the adjusting device.

17. The method for adjusting the optical system as claimed in claim 1, wherein the optical object is a second optical module, the second optical module is used to carry a second optical element, and the adjusting device is disposed on an upper surface of the second optical module.

18. A method for adjusting the optical system, comprising:

a positioning device positioning a first optical module and a second optical module;

a measuring device measuring an angle difference between a main axis of the first optical module and a first optical axis of a first optical element carried by the first optical module, and obtaining a first measurement information;

an adjusting device changing a shape of a first adjustment sub-assembly of an adjustment assembly connected to the first optical module according to the first measurement information; and assembling the first optical module with a second optical module which carries a second optical element having a second optical axis, wherein the first optical axis of the first optical element is parallel to a second optical axis of the second optical element.

19. The method for adjusting the optical system as claimed in claim 18, further comprising:

the measuring device measuring an angle difference between the second optical axis and a central axis of an image sensor module, to obtain a second measurement information; and the positioning device positioning the assembled first and second optical module into an alignment position according to the second measurement information, and making the first optical axis and the second optical axis parallel to the central axis of the image sensor module.

20. The method for adjusting the optical system as claimed in claim 19, wherein the step of making the first optical axis and the second optical axis parallel to the central axis of the image sensor module includes:

adjusting a shape of a second adjustment sub-assembly of the adjustment assembly using the adjusting device, and assembling the second optical module with the image sensor module.

* * * * *